United States Patent
Petrov et al.

(10) Patent No.: US 12,334,709 B2
(45) Date of Patent: Jun. 17, 2025

(54) LIGHT EMISSION APPARATUS

(71) Applicant: Artilux, Inc., Menlo Park, CA (US)

(72) Inventors: Konstantin P. Petrov, Hsinchu County (TW); Yun-Chung Na, San Jose, CA (US)

(73) Assignee: Artilux, Inc., Menlo Park, CA (US)

( * ) Notice: Subject to any disclaimer, the term of this patent is extended or adjusted under 35 U.S.C. 154(b) by 578 days.

(21) Appl. No.: 17/726,229

(22) Filed: Apr. 21, 2022

(65) Prior Publication Data

US 2022/0247151 A1     Aug. 4, 2022

Related U.S. Application Data

(63) Continuation-in-part of application No. 17/071,970, filed on Oct. 15, 2020, now Pat. No. 11,342,725.

(60) Provisional application No. 62/916,243, filed on Oct. 17, 2019.

(51) Int. Cl.
   *H01S 5/062* (2006.01)
   *H01S 5/042* (2006.01)

(52) U.S. Cl.
   CPC ........ *H01S 5/06216* (2013.01); *H01S 5/0428* (2013.01)

(58) Field of Classification Search
   CPC ............................ H01S 5/4018; H01S 5/06216
   See application file for complete search history.

(56) References Cited

U.S. PATENT DOCUMENTS

| | | | |
|---|---|---|---|
| 7,545,839 B2 * | 6/2009 | Giorgi | H01S 5/042 |
| | | | 372/38.07 |
| 9,847,736 B2 * | 12/2017 | Grootjans | G01C 3/08 |
| 2009/0129415 A1 | 5/2009 | Li et al. | |
| 2017/0025816 A1 | 1/2017 | Tanaka | |
| 2017/0187164 A1 | 6/2017 | Thompson et al. | |
| 2018/0261975 A1 | 9/2018 | Pavlov et al. | |
| 2018/0323576 A1 * | 11/2018 | Crawford | H02M 1/088 |

* cited by examiner

*Primary Examiner* — Tuan N Nguyen
(74) *Attorney, Agent, or Firm* — Dority & Manning, P.A.

(57) ABSTRACT

A light emission system including a first sub-system. The first sub-system includes a storage inductor having a first inductor terminal coupled to a voltage source and a second inductor terminal; a storage capacitor having a first capacitor terminal coupled to the first terminal of the storage inductor, and a second capacitor terminal coupled to a reference voltage node; a switch having a control terminal coupled to a driver circuitry that sends a modulation signal to open or close the switch, a first channel terminal coupled to the second inductor terminal, and a second channel terminal coupled to the reference voltage node; and a load having N laser diodes coupled in series, where the N laser diodes include a first laser diode having a terminal coupled to the second inductor terminal, and an N-th laser diode having a terminal coupled to the reference voltage node.

20 Claims, 10 Drawing Sheets

LIGHT EMISSION APPARATUS

CROSS REFERENCE TO RELATED APPLICATIONS

This application is a continuation-in-part of and claims priority to U.S. patent application Ser. No. 17/071,970, having a filing date of Oct. 15, 2020, which claims the benefit of U.S. Provisional Patent Application No. 62/916,243, filed Oct. 17, 2019, each of which is incorporated by reference in its entirety herein.

BACKGROUND

Optical technologies have been widely used in many applications, such as cell phone, digital still camera and vehicle Light Detection and Ranging (LiDAR). In a time of flight (ToF) system, a light emission apparatus is equipped for emitting the light toward a targeted object and a light receiving apparatus is equipped for receiving the light reflected from the targeted object to obtain the depth information.

SUMMARY

According to an embodiment of the present disclosure, a light emission system includes a first sub-system. The first sub-system includes a storage inductor having a first inductor terminal coupled to a voltage source and a second inductor terminal; a storage capacitor having a first capacitor terminal coupled to the first terminal of the storage inductor, and a second capacitor terminal coupled to a reference voltage node; a switch having a control terminal coupled to driver circuitry that sends a modulation signal to open or close the switch, a first channel terminal coupled to the second inductor terminal, and a second channel terminal coupled to the reference voltage node; and a load. The load includes N laser diodes coupled in series, where N is an integer larger than or equal to 2. The N laser diodes include a first laser diode having a terminal coupled to the second inductor terminal; and an N-th laser diode having a terminal coupled to the reference voltage node.

According to another embodiment of the present disclosure, a light emission system includes a first sub-system. The first sub-system includes a storage inductor having a first inductor terminal coupled to a voltage source and a second inductor terminal; a storage capacitor having a first capacitor terminal coupled to the first terminal of the storage inductor, and a second capacitor terminal coupled to a reference voltage node; a switch having a control terminal coupled to driver circuitry that sends a modulation signal to open or close the switch, a first channel terminal coupled to the second inductor terminal, and a second channel terminal coupled to the reference voltage node; and a load. The load includes a DC-blocking capacitor having a first DC-blocking capacitor terminal coupled to the second inductor terminal, and a second DC-blocking capacitor terminal; N laser diodes coupled in series, where N is an integer larger than or equal to 2. The N laser diodes include a first laser diode having a terminal coupled to the second DC-blocking capacitor terminal; and an N-th laser diode having a terminal coupled to the reference voltage node.

In some implementations, the light emission system may include a reflective element; one or more first optical elements arranged to focus light beams generated by the N laser diodes to the reflective element; and one or more second optical elements arranged to direct the light beams from the reflective element to an object in an environment.

In some implementations, the light emission system may include a plurality of sub-systems including the first sub-system, where the one or more first optical elements are arranged to focus light beams generated by the plurality of sub-systems toward the reflective element. In some implementations, the switch may include a gallium nitride field-effect transistor.

In some implementations, the first sub-system may be configured to operate under an idle mode, a charge mode, or an emission mode. In the idle mode, the switch is open, and the storage capacitor is configured to store energy from the voltage source. In the charge mode, the switch is closed, and the storage inductor is configured to store energy released from the storage capacitor. In the emission mode, the switch is open, and the storage inductor is configured to release current to drive the N laser diodes.

In some implementations, the light emission system may be configured to output light having a wavelength within a short-wave infrared spectrum. In some implementations, the light emission system may be configured to output light having a pulse width equal to or higher than 1 ns, and a peak output power equal to or higher than 1 kW.

These and other objectives of the present disclosure will become obvious to those of ordinary skill in the art after reading the following detailed description of the alternative embodiments that are illustrated in the various figures and drawings.

These and other objectives of the present disclosure will no doubt become obvious to those of ordinary skill in the art after reading the following detailed description of the preferred embodiment that is illustrated in the various figures and drawings.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings.

DETAILED DESCRIPTION

Figure 1:
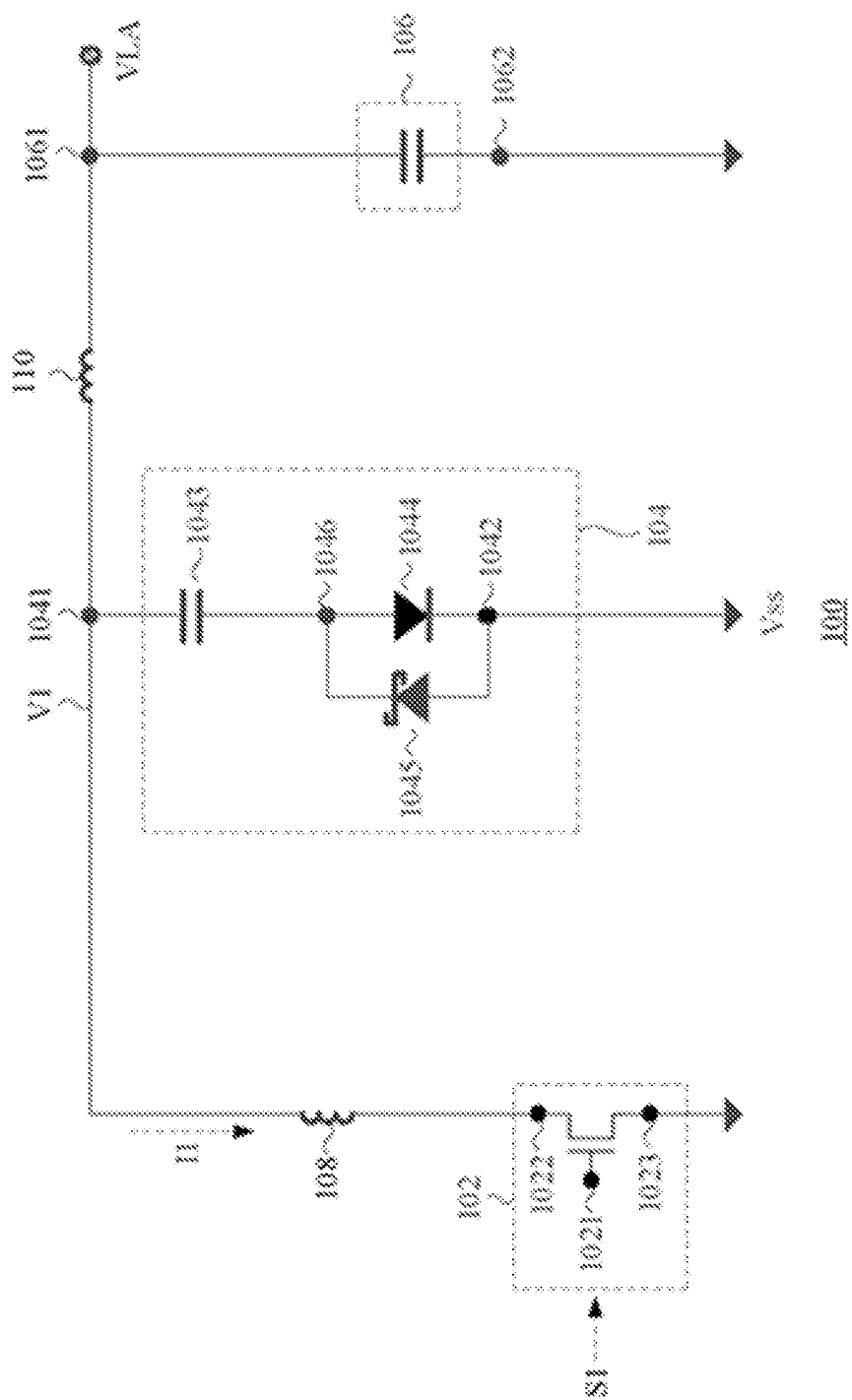
FIG. 1 illustrates an example of a circuit diagram of a light emission apparatus.

FIG. 1 illustrates a circuit diagram of a light emission apparatus 100, according to some embodiments. The light emission apparatus 100 includes a transistor 102, a load 104, a capacitor 106, an inductor 108 and an inductor 110. The transistor 102 includes a control terminal 1021, a channel terminal 1022 and a channel terminal 1023, where the control terminal 1021 is configured to receive a modulation signal S1, the channel terminal 1022 is coupled to a terminal 1041 of the load 104 through the inductor 108, and the channel terminal 1023 is coupled to a fixed voltage Vss (e.g., ground voltage). The load 104 includes two terminals, where a terminal 1041 is coupled to the channel terminal 1022 of the transistor 102 and a terminal 1042 is coupled to the fixed voltage Vss (e.g., ground voltage). The capacitor 106 includes two terminals, where a terminal 1061 is coupled to the terminal 1041 through the inductor 110, and a terminal 1062 is coupled to the fixed voltage Vss (e.g., ground voltage).

In some embodiments, the transistor 102 can be a power transistor having a higher voltage and current tolerance, compared with a general or a low power transistor. The transistor 102 is configured to generate a driving signal including a driving current I1 and a driving voltage V1 to the load 104 according to the modulation signal S1, where the modulation signal S1 can be a clock signal or a continuous pulse signal.

In some embodiments, the load 104 includes a capacitor 1043, a laser diode 1044 and a Schottky diode 1045. The capacitor 1043 is coupled between the terminal 1041 and the terminal 1046. The laser diode 1044 is coupled between the terminal 1046 and the terminal 1042, and configured to emit a light. The Schottky diode 1045 is also coupled between the terminal 1046 and the terminal 1042, which is coupled with the laser diode 1044 in parallel.

In some embodiments, the capacitor 106 is configured to stabilize an external supply voltage VLA, which protects from spikes or dips that may occur at a power line.

In some embodiments, the inductor 108 and the inductor 110 can be parasitic inductors formed on printed-circuit board (PCB), and configured to store energy.

The capacitor 1043 is coupled between the terminal 1041 and the laser diode 1044 such that the capacitor 1043 and the laser diode 1044 are coupled in series and forms an AC-coupled configuration. With this configuration, the average DC current of the driving current I1 at terminal 1041 can be isolated by the capacitor 1043, and the loading of the load 104 will not significantly reduce the performance of the light emission apparatus 100. To have a better operation of the laser diode 1044, the Schottky diode 1045 is added in anti-parallel connection with the laser diode 1044, such that the average voltage across the diode laser 1044 can be positive. Notably, the Schottky diode 1045 is an embodiment to restore the average DC level of the voltage across the laser diode 1044, other devices that may achieve the same or similar functions can be used as well.

As the degradation of the high frequency components is relatively small when using AC-coupled configuration to drive the laser diode 1044, the light emission apparatus 100 will have better performance for high-speed application. For example, the light emission apparatus 100 may be applied in an application where the frequency of the modulation signal S1 is higher than 100 MHz.

Figure 2:
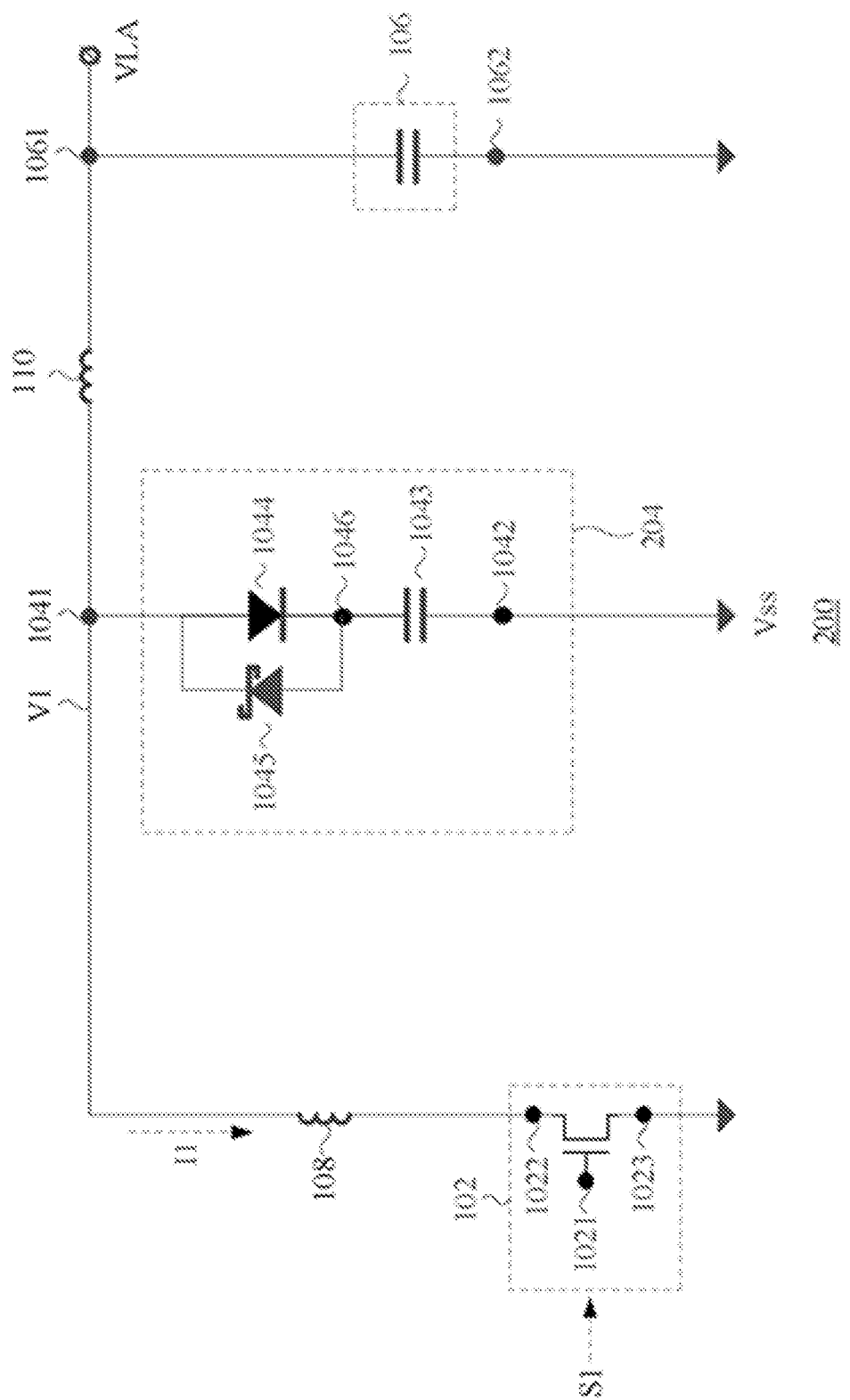
FIG. 2 illustrates an example of a circuit diagram of a light emission apparatus.

FIG. 2 illustrates a circuit diagram of a light emission apparatus 200, according to some embodiments. The light emission apparatus 200 includes a transistor 102, a load 204, a capacitor 106, an inductor 108, and an inductor 110. The transistor 102 includes a control terminal 1021, a channel terminal 1022 and a channel terminal 1023, where the control terminal 1021 is configured to receive a modulation signal S1, the channel terminal 1022 is coupled to a terminal 1041 of the load 204 and the channel terminal 1023 is coupled to a fixed voltage Vss (e.g., ground voltage). The load 204 includes two terminals, where a terminal 1041 is coupled to the channel terminal 1022 of the transistor 102 through the inductor 108, and a terminal 1042 is coupled to the fixed voltage Vss (e.g., ground voltage). The capacitor 106 includes two terminals, where a terminal 1061 is coupled to the terminal 1041 through the inductor 110, and a terminal 1062 is coupled to the fixed voltage Vss (e.g., ground voltage).

Compared to the light emission apparatus 100, in this embodiment, the difference is in the configuration of the load 204. The light emission apparatus 200 includes the load 204 having a capacitor 1043, a laser diode 1044 and a Schottky diode 1045. The capacitor 1043 is coupled between the terminal 1042 and the terminal 1046. The laser diode 1044 is coupled between the terminal 1046 and the terminal 1041, and configured to emit a light. The Schottky diode 1045 is also coupled between the terminal 1046 and the terminal 1041, which is coupled with the laser diode 1044 in anti-parallel.

In some embodiments, the transistor 102 of the light emission apparatus 200 can be a power transistor having a higher voltage and current tolerance, compared with a general or a low power transistor. The transistor 102 is configured to generate a driving signal including a driving current I1 and a driving voltage V1 to the load 204 according to the modulation signal S1, where the modulation signal S1 can be a clock signal or a continuous pulse signal.

In some embodiments, the capacitor 106 is configured to stabilize an external supply voltage VLA, which protects from spikes or dips that occur at a power line.

In some embodiments, the inductor 108 and the inductor 110 can be parasitic inductors formed on printed-circuit board (PCB), and configured to store energy.

The capacitor 1043 is coupled between the terminal 1041 and the laser diode 1044 such that the capacitor 1043 and the laser diode are coupled in series and forms an AC-coupled configuration. With this configuration, the average DC current of the driving current I1 at terminal 1041 can be isolated by the capacitor 1043, the loading of the load 104 will not significantly reduce the performance of the light emission apparatus 100. To have a better operation of the laser diode 1044, the Schottky diode 1045 is added in anti-parallel connection with the laser diode 1044, such that the average voltage across the diode laser 1044 can be positive. Notably, the Schottky diode 1045 is an embodiment to restore the average DC level of the voltage across the laser diode 1044, other devices that may achieve the same or similar functions can be used as well.

As the degradation of the high frequency components is relatively small when using an AC-coupled configuration to drive the laser diode 1044, the light emission apparatus 200 will have better performance for high-speed applications. For example, the light emission apparatus 200 may be applied in an application where the frequency of the modulation signal S1 is higher than 100 MHz.

The present disclosure provides a light emission apparatus having the following features. First, the driving voltage V1 generated by the transistor 102 is a modulation signal, where similar to a clock signal, the driving voltage V1 goes up and down. During operation, the transistor 102 periodically shorts the external supply VLA to the fixed voltage Vss (e.g., ground) through inductors 108 and 110. From the structure prospect, the transistor 102, the external supply VLA, and the load 104/204 are coupled in parallel.

Second, the load 104/204 is AC-coupled to output of the transistor 102 and isolates DC current on the terminal 1041. The driving current I1 is generated depending on the voltage of the driving voltage V1 and its frequency, since impedances of parasitic inductors 108 and 110 in series with the load 104/204 increase with frequency. The increased impedance results in lower overall current during both charge and discharge phases of periodic pulse operation. If frequency increases, the supply voltage must increase to maintain desired current. AC-coupling allows the parallel-connected external supply voltage VLA to exceed the laser threshold without any current flow in the absence of clock pulses. This allows simple control of both pulse amplitude and duration without any safety/shutdown circuitry.

Third, the laser diode 1044 is connected directly in parallel with a reversed Schottky diode 1045. Its purpose is DC restoration and makes possible applying long bursts of pulses to the load 104/204. This reversed parallel connection works to partially compensate distortion of the burst envelope.

Figure 3:
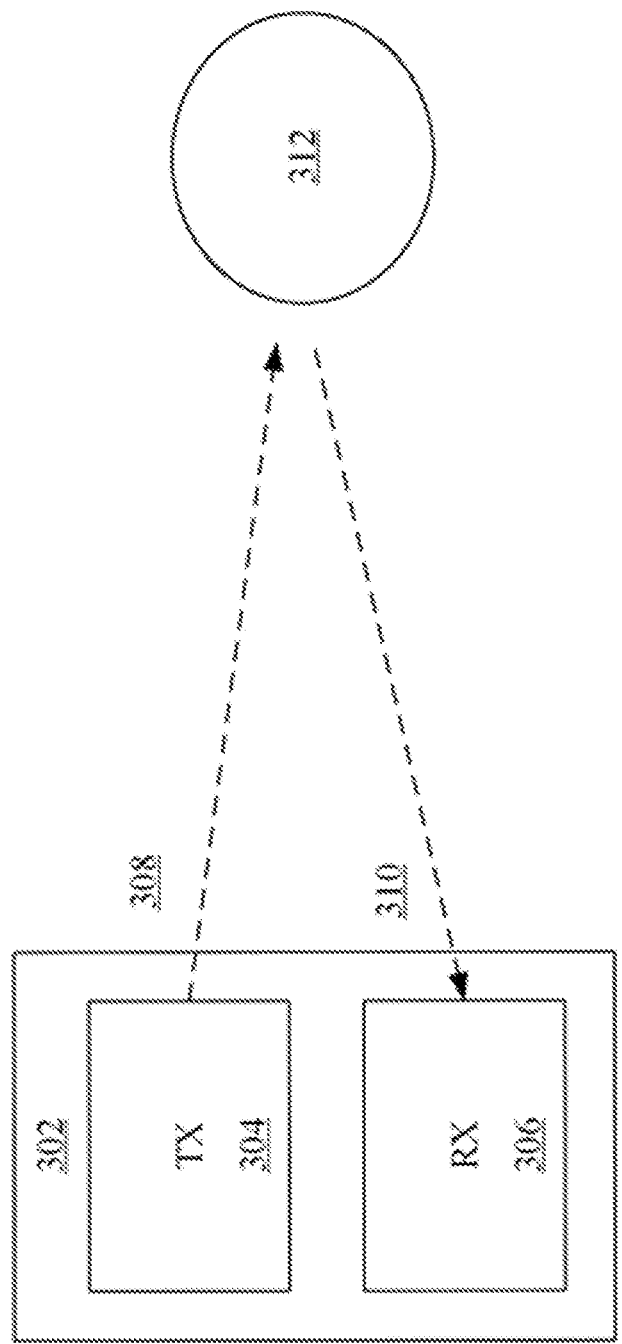
FIG. 3 illustrates an example of a system for sensing an object in an environment.

FIG. 3 illustrates an example of a system 300 for sensing an object 312 in an environment. The system 300 includes a device 302 and an object 312. The device 302 may be a mobile device (e.g., a smartphone, a tablet, etc.), a vehicle, and/or any other devices that are implemented to have functions for sensing objects. The device 302 includes a transmitter 304 and a receiver 306. In connection with the embodiments illustrated in the present disclosure, the light emission apparatus 100 and the light emission apparatus 200 can be implemented in the transmitter 304. The transmitter 304 is configured to transmit a light 308 generated by the laser diode 1044. In some embodiments, the light 308 may be a pulsed signal. In some other embodiments, the light 308 may be a periodic signal (e.g., a sine wave, a square wave, etc.) having one or more operating frequencies. The light 308 reflects from a surface of the object 312, and the reflected light 310 is received by the receiver 306. The receiver 306 may include one or more photodetectors for detecting the reflected light 310 and determine the distance between the device 302 and the object 312.

Figure 4A:
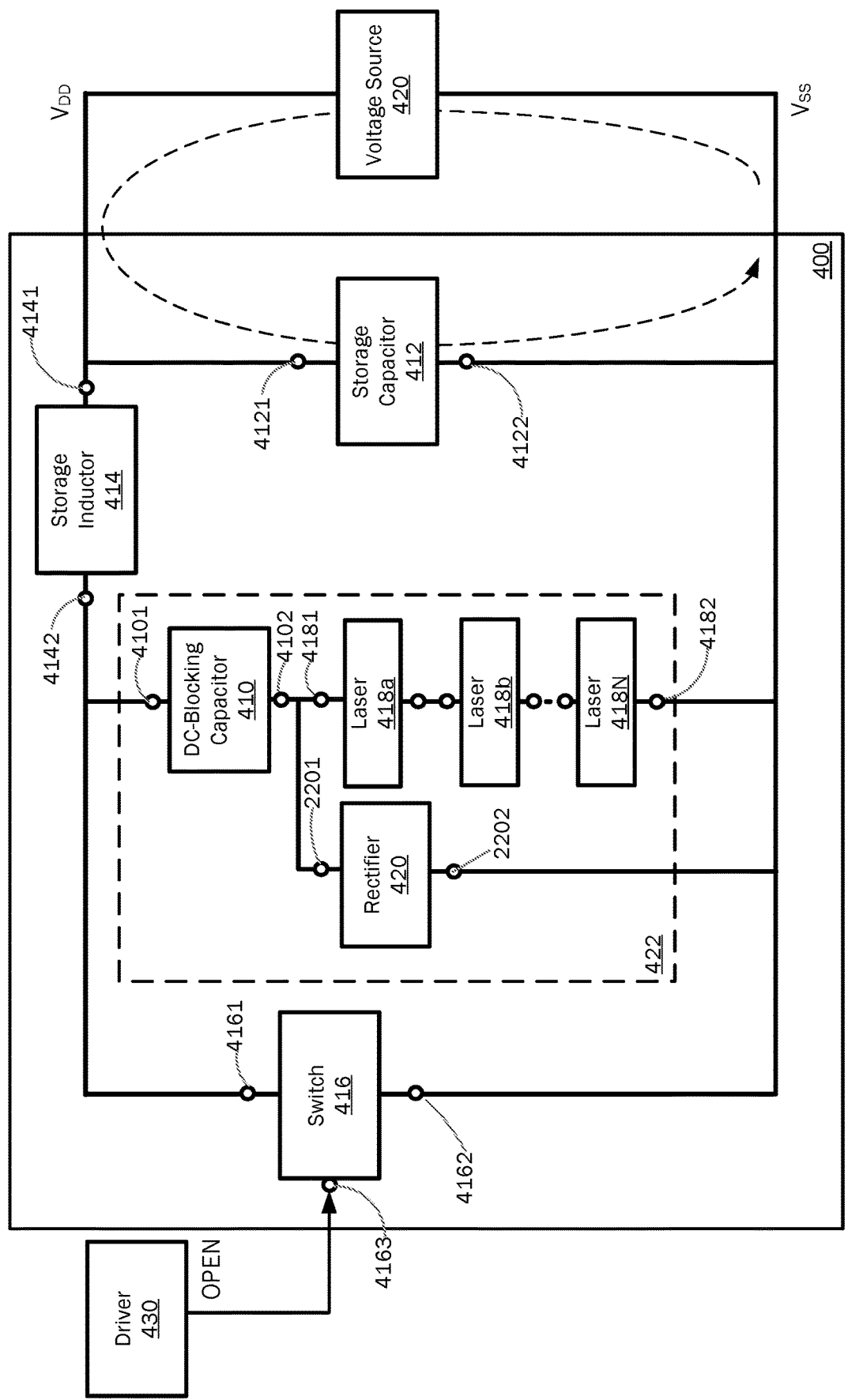
FIGS. 4A-4C illustrate an example of a circuit block diagram of a light emission apparatus that is AC-coupled.

FIG. 4A illustrates an example of a circuit block diagram of a light emission apparatus 400 that is AC-coupled. The light emission apparatus 400 can be a light emission system by itself or a sub-system of a larger light emission system, as disclosed in FIG. 6. The light emission apparatus 400 includes a storage inductor 414 (e.g., inductor 110 in FIG. 1), a storage capacitor 412 (e.g., capacitor 106 in FIG. 1), a switch 416 (e.g., transistor 102 in FIG. 1), and a load 422.

The storage inductor 414 includes a first inductor terminal 4141 coupled (e.g., electrically coupled) to a voltage source 420 having a positive terminal $V_{DD}$ (e.g., 5V) and a reference terminal Vss (e.g., ground), and a second inductor terminal 4142. In general, the value of the storage inductor 414 is chosen to store sufficient energy to drive the load 422. In some implementations, the storage inductor 414 may be on the order of several nanohenry or any suitable values.

The storage capacitor 412 includes a first capacitor terminal 4121 coupled to the first terminal 4141 of the storage inductor 414, and a second capacitor terminal 4122 coupled to a reference voltage node (e.g., Vss). In general, the value of the storage capacitor 412 is chosen to store sufficient energy for the storage inductor 414. In some implementations, the storage capacitor 412 may be on the order of several nanofarad or any suitable values.

The switch 416 includes a control terminal 4163 coupled to a driver circuitry 430 that sends a modulation signal to open or close the switch 416, a first channel terminal 4161 coupled to the second inductor terminal 4142, and a second channel terminal 4162 coupled to the reference voltage node. In some implementations, the switch 416 can be a gallium nitride field-effect transistor, which can provide a fast switching time (e.g., nano-sec range).

The load 422 includes a DC-blocking capacitor 410, N laser diodes 418a-N coupled in series, where N is any positive integer (e.g., 2, 7, or any suitable number), and a rectifier 420. The DC-blocking capacitor 410 includes a first DC-blocking capacitor terminal 4101 coupled to the second inductor terminal 4142, and a second DC-blocking capacitor terminal 4102. The capacitor 1043 as described in reference to FIG. 1 can be an example of the DC-blocking capacitor 410 that is arranged to block averaged DC signals.

The laser diode 1044 as described in reference to FIG. 1 can be an example of any one of the N laser diodes 418a-N. The first laser diode 418a has a terminal 4181 coupled to the second DC-blocking capacitor terminal 4102, and the N-th laser diode 418N has a terminal 4182 coupled to the reference voltage node. By coupling the N laser diodes in series, the overall output optical power of the light emitted by the light emission apparatus 400 can be increased by N-folds.

The Schottky diode 1045 as described in reference to FIG. 1 can be an example of the rectifier 420, which has a purpose of DC restoration, and makes possible to apply long bursts of pulses to the load 422. In general, this reversed parallel connection works to partially compensate distortion of the burst envelope. The rectifier 420 has a first rectifier terminal 2201 coupled to the second DC-blocking capacitor terminal 4102 and a second rectifier terminal 2202 coupled to the reference voltage.

In general, the light emission apparatus 400 may operate under an idle mode, a charge mode, or an emission mode. Referring to FIG. 4A, in the idle mode, the switch 416 receives an open signal from the driver 430. The switch 416 is opened, and the storage capacitor 412 is fully charged to the external power supply voltage $V_{DD}$. If the load 422 is designed such that the total threshold voltage for turning on the N series-coupled lasers 418a-N, $V_{th}$, is greater than the external power supply voltage $V_{DD}$, no light will be emitted by the light emission apparatus 400 under the idle mode.

Figure 4B:
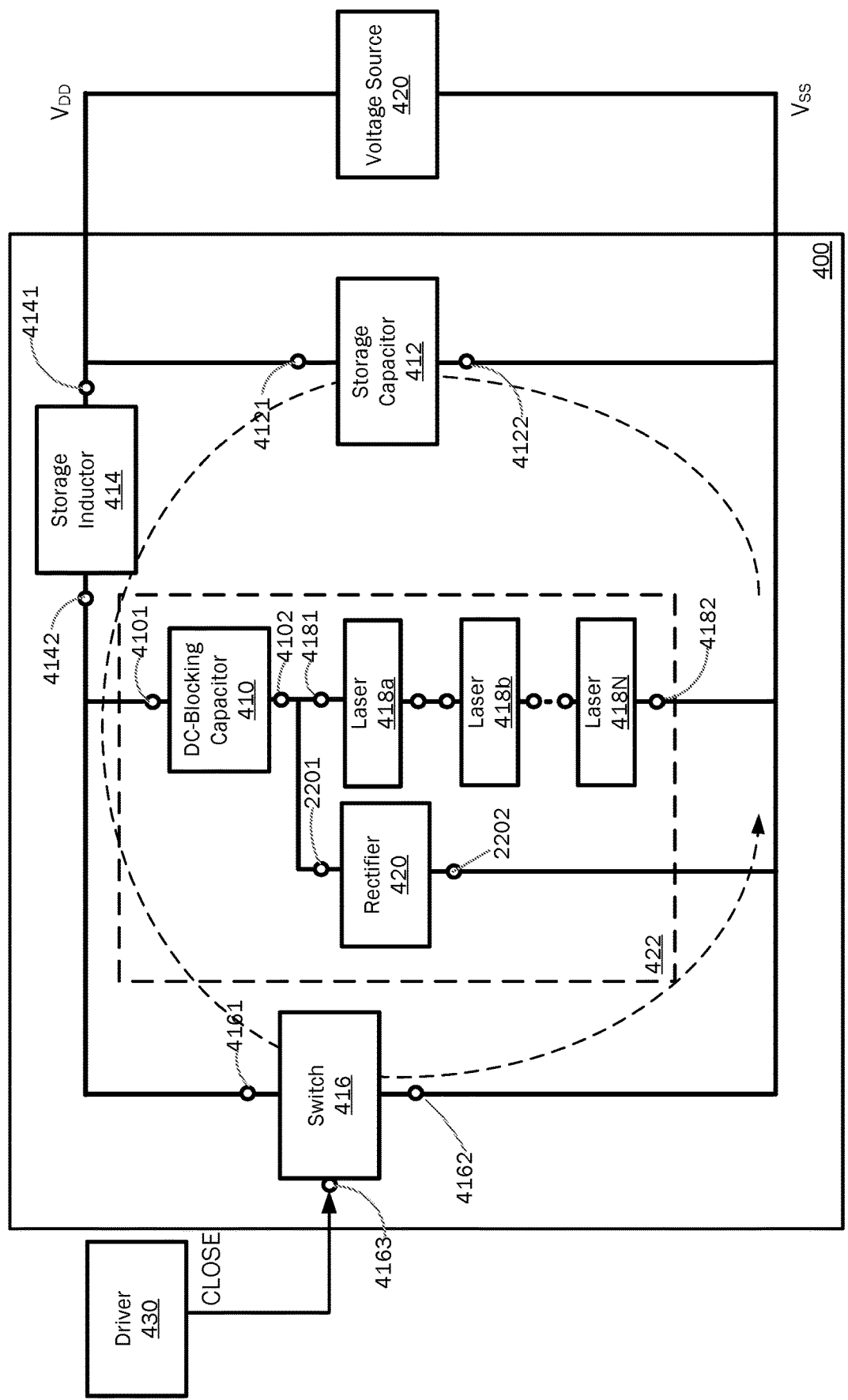

Referring to FIG. 4B as an example, in the charge mode, the switch 416 receives a close signal from the driver 430. The switch 416 is closed, which shorts the storage capacitor 412 to the reference voltage (e.g., ground) via the storage inductor 414. The energy discharged from the storage capacitor 412 induces a current flow through the storage inductor 414, which increases according to an exponentially decaying transient function of $I(t)=(V_{DD}/R_{DS})\cdot(\exp(-t/\tau)-1)$, where $\tau$ represents the time constant $\tau=L/R_{DS}$, L represents the inductance value of the storage inductor 414, and $R_{DS}$ represents the source-drain on-state series resistance of the switch 416. Here, $V_{DD}$ is chosen such that the maximum possible charge current (i.e., $V_{DD}/R_{DS}$) exceeds the desired charge current for driving the load 422. Notably, due to the small value of $R_{DS}$, in the charge mode, the voltage across the load 422 throughout the charge cycle is less than the supply voltage $V_{DD}$, such that the laser diodes 418a-N remain below threshold and do not emit any light by design.

The time for keeping the light emission apparatus 400 in the charge mode can be designed based on the desirable current $I_{op}$ flowing through the storage inductor. In general, the desirable current $I_{op}$ is designed such that when $I_{op}$ flows through the diode lasers 418a-N in the emission mode, the voltage across the load 422 will be greater than the threshold voltage over a desirable period of time to turn on the diode lasers 418a-N.

Figure 4C:
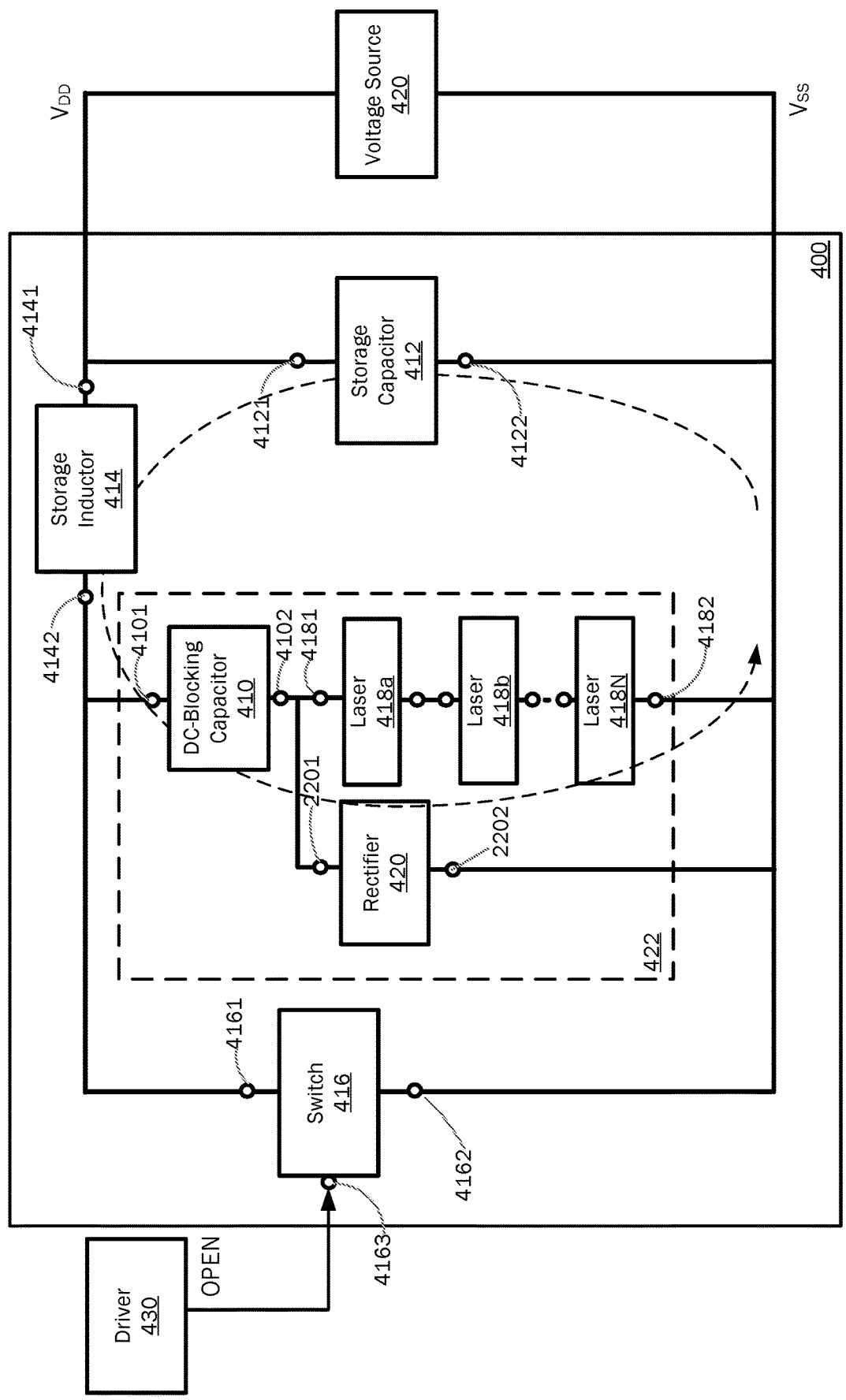

Referring to FIG. 4C as an example, in the emission mode, the switch 416 receives an open signal from the driver 430. As the switch 416 opens, the energy stored in the storage inductor 414 is discharged as electrical current. Since the current through the storage inductor 414 cannot change instantly to zero, a voltage develops at the second inductor terminal 4142 to keep the current going. The voltage increases to the point where the load 422 begins to conduct the same initial current Iop as the storage inductor 414 was carrying. Such current flow enables the diode lasers 418a-N because the voltage across the load 422 due to the current flow is greater than the threshold voltage for turning on the diode lasers 418a-N. The emission mode ends when power stored in the storage inductor 414 is fully depleted, and the light emission apparatus 400 naturally enters back to the idle mode if the switch 416 remains open.

Figure 5A:
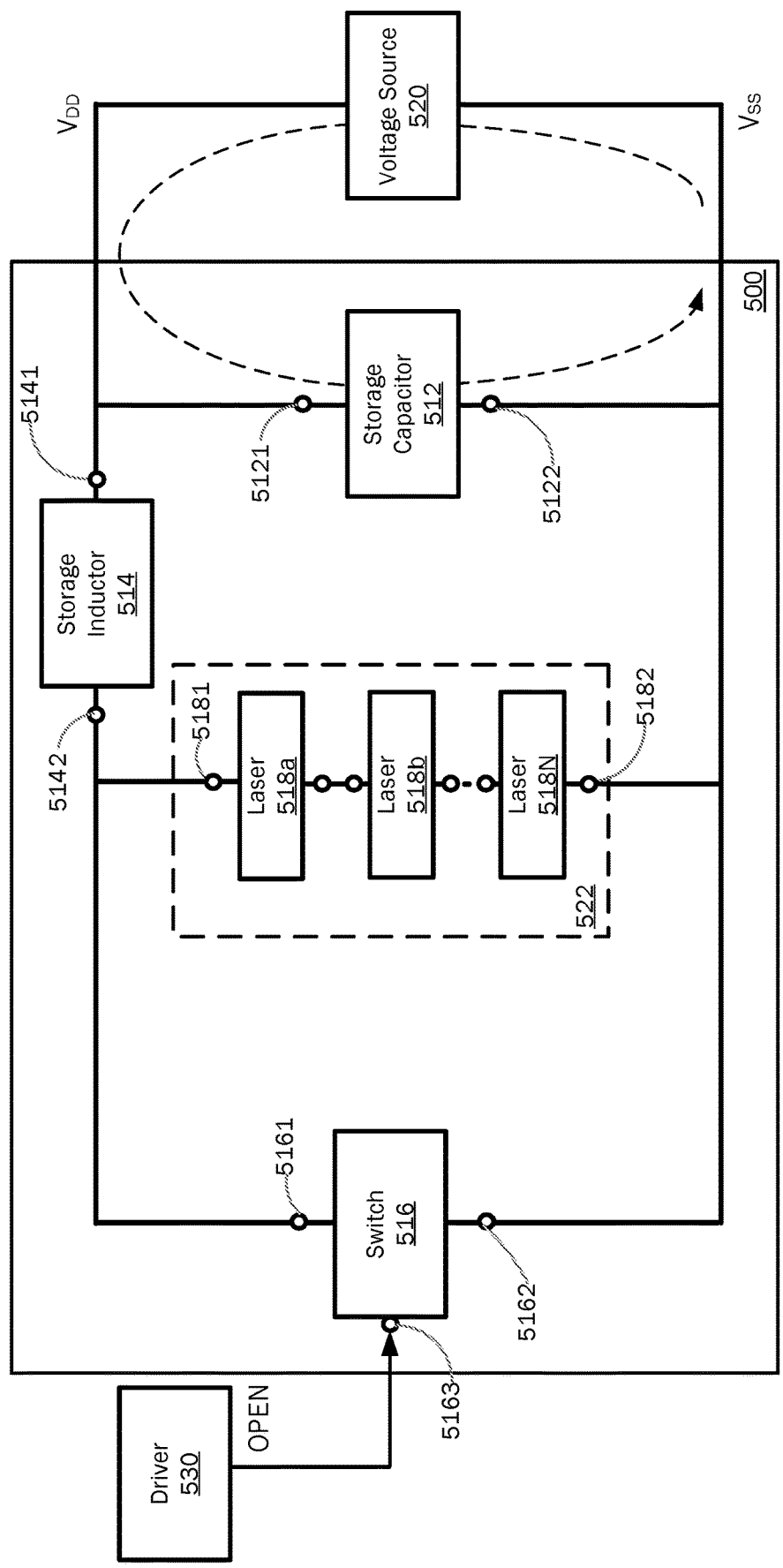
FIGS. 5A-5C illustrate an example of a circuit block diagram of a light emission apparatus that is DC-coupled.

FIG. 5A illustrates an example of a circuit block diagram of a light emission apparatus 500 that is DC-coupled. The light emission apparatus 500 can be a light emission system by itself or a sub-system of a larger light emission system, as disclosed in FIG. 6. The light emission apparatus 500 includes a storage inductor 514 (e.g., inductor 110 in FIG. 1), a storage capacitor 512 (e.g., capacitor 106 in FIG. 1), a switch 516 (e.g., transistor 102 in FIG. 1), and a load 522.

The storage inductor 514 includes a first inductor terminal 5141 coupled (e.g., electrically coupled) to a voltage source 520 having a positive terminal $V_{DD}$ (e.g., 5V) and a reference terminal Vss (e.g., ground), and a second inductor terminal 5142. In general, the value of the storage inductor 514 is chosen to store sufficient energy to drive the load 522. In some implementations, the storage inductor 514 may be on the order of several nanohenry or any suitable values.

The storage capacitor 512 includes a first capacitor terminal 5121 coupled to the first inductor terminal 5141, and a second capacitor terminal 5122 coupled to a reference voltage node (e.g., Vss). In general, the value of the storage capacitor 512 is chosen to store sufficient energy for the storage inductor 514. In some implementations, the storage capacitor 512 may be on the order of tens to hundreds microfarad or any suitable values.

The switch 516 includes a control terminal 5163 coupled to a driver circuitry 530 that sends a modulation signal to open or close the switch 516, a first channel terminal 5161 coupled to the second inductor terminal 5142, and a second channel terminal 5162 coupled to the reference voltage node. In some implementations, the switch 516 can be a gallium nitride field-effect transistor.

The load 522 includes N laser diodes 518a-N that are coupled in series, where N is any positive integer (e.g., 2, 7, or any suitable number). The laser diode 1044 as described in reference to FIG. 1 can be an example of any one of the N laser diodes 518a-N. The first laser diode 518a has a terminal 5181 coupled to the second inductor terminal 5142, and the N-th laser diode 518N has a terminal 5182 coupled to the reference voltage node. By coupling the N laser diodes in series, the overall output optical power of the light emitted by the light emission apparatus 500 can be increased by N-folds.

In general, the light emission apparatus 500 may operate under an idle mode, a charge mode, or an emission mode. Referring to FIG. 5A, in the idle mode, the switch 516 receives an open signal from the driver 530. The switch 516 is open, and the storage capacitor 512 is fully charged to the external power supply voltage $V_{DD}$. If the load 522 is designed such that the total threshold voltage for turning on the N series-coupled lasers 518a-N, $V_{th}$, is greater than the external power supply voltage $V_{DO}$, no light will be emitted by the light emission apparatus 500 under the idle mode.

Figure 5B:
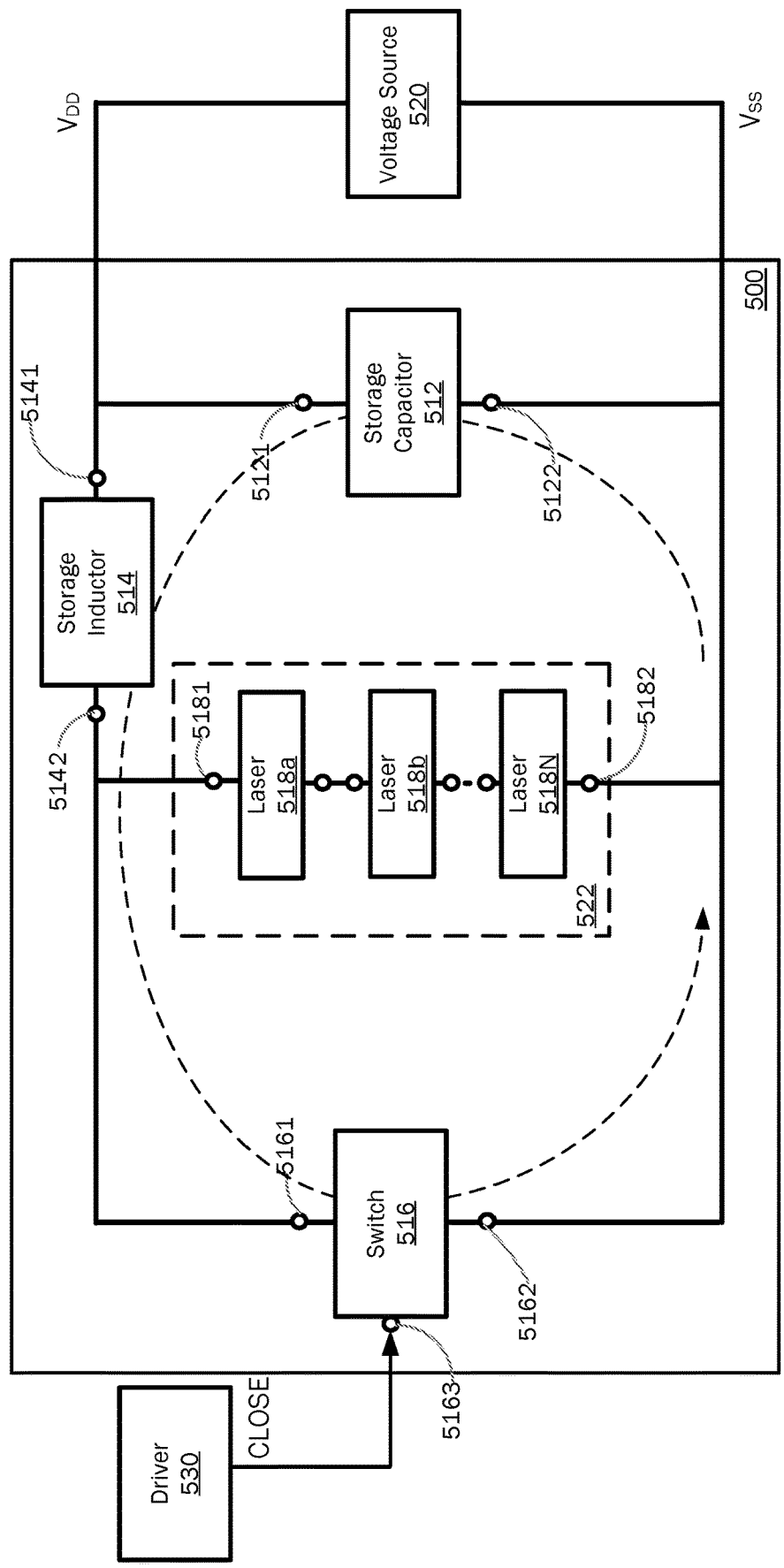

Referring to FIG. 5B as an example, in the charge mode, the switch 516 receives a close signal from the driver 530. The switch 516 is closed, which shorts the storage capacitor 512 to the reference voltage (e.g., ground) via the storage inductor 514. The energy discharged from the storage capacitor 512 induces a current flow through the storage inductor 514, which increases according to an exponentially decaying transient function of $I(t)=(V_{DD}/R_{DS}) \cdot (\exp(-t/\tau)-1)$, where $\tau$ represents the time constant $\tau=L/R_{DS}$, L represents the inductance value of the storage inductor 514, and $R_{DS}$ represents the source-drain on-state series resistance of the switch 516. Here, $V_{DD}$ is chosen such that the maximum possible charge current (i.e., $V_{DD}/R_{DS}$) exceeds the desired charge current for driving the load 522. Notably, due to the small value of $R_{DS}$, in the charge mode, the voltage across the load 522 throughout the charge cycle is less than the supply voltage $V_{DD}$, such that the laser diodes 418a-N remain below threshold and does not emit any light by design.

The time for keeping the light emission apparatus 500 in the charge mode can be designed based on the desirable current $I_{op}$ flowing through the storage inductor. In general, the desirable current $I_{op}$ is designed such that when $I_{op}$ flows through the diode lasers 518a-N in the emission mode, the voltage across the load 522 will be greater than the threshold voltage over a desirable period of time to turn on the diode lasers 518a-N.

Figure 5C:
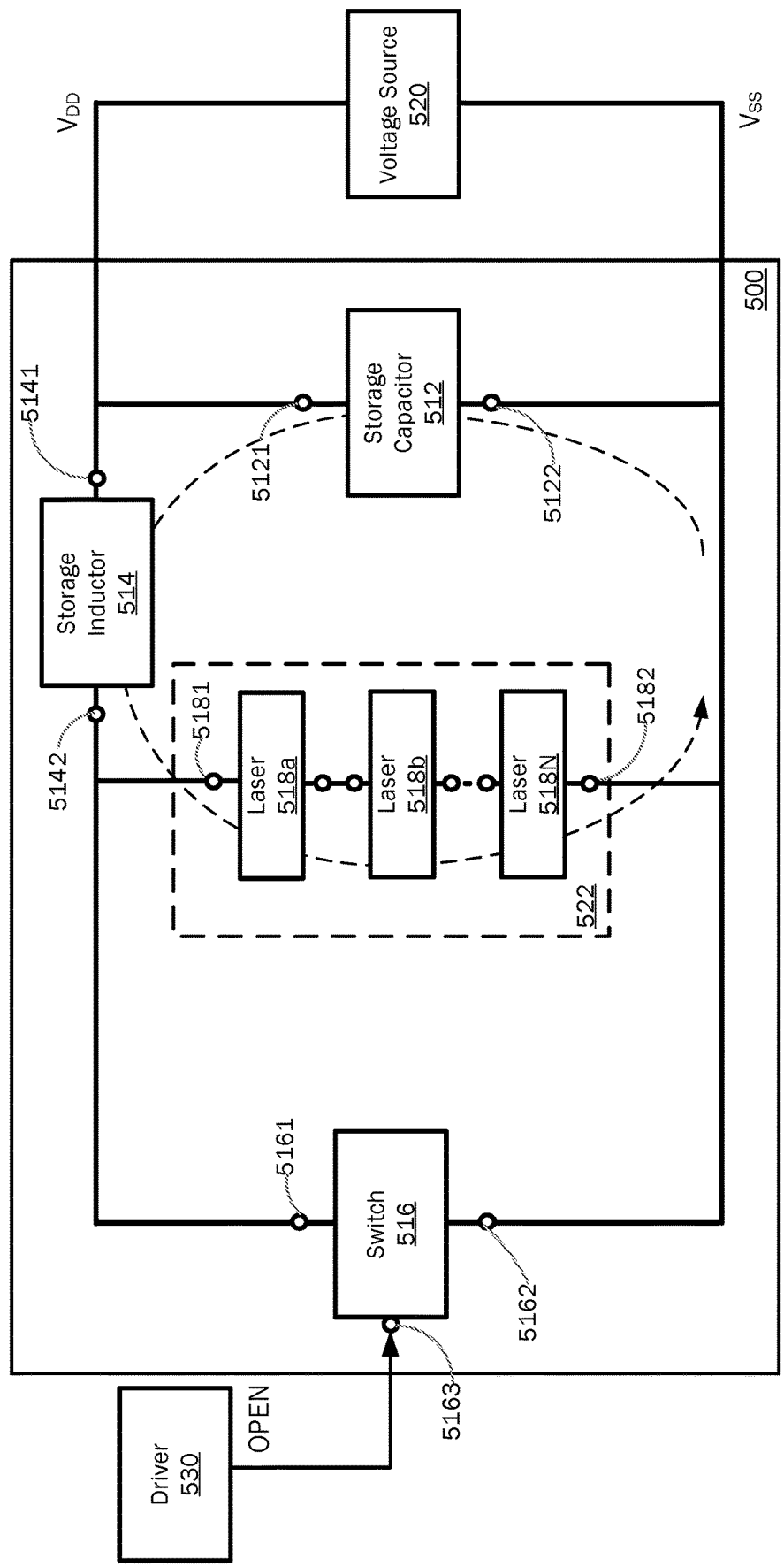

Referring to FIG. 5C as an example, in the emission mode, the switch 516 receives an open signal from the driver 530. As the switch 516 opens, the energy stored in the storage inductor 514 is discharged as electrical current. Since the current through the storage inductor 514 cannot change instantly to zero, a voltage develops at the second inductor terminal 5142 to keep the current going. The voltage increases to the point where the load 522 begins to conduct the same initial current Iop as the storage inductor 514 was carrying. Such current flow enables the diode lasers 518a-N because the voltage across the load 522 due to the current flow is greater than the threshold voltage for turning on the diode lasers 518a-N. The emission mode ends when power stored in the storage inductor 514 is fully depleted, and the light emission apparatus 500 naturally enters back to the idle mode if the switch 516 remains open.

Figure 6:
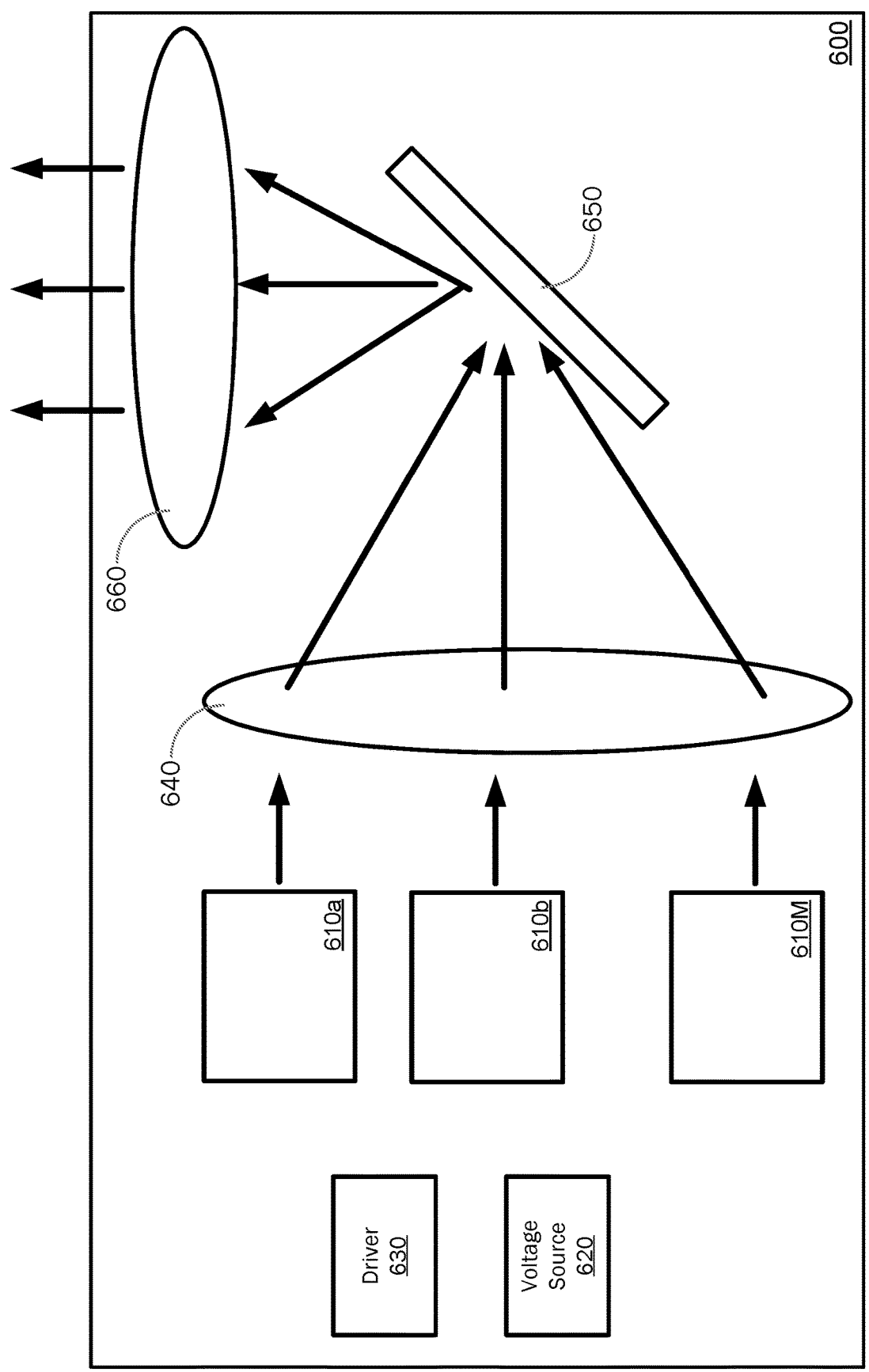
FIG. 6 illustrates an example of an optical emission system.

FIG. 6 illustrates an example of an optical emission system 600 with a high optical power output (e.g., kW peak power). The optical emission system 600 includes M sub-systems 610, where M is a positive integer, one or more voltage sources 620 (e.g., voltage source 510/520), one or more drivers 630 (e.g., driver 430/530), one or more first optical elements 640 arranged to focus light beams generated by the laser diodes (e.g., focusing lens), one or more reflective elements 650 (e.g., MEMS (micro-electromechanical system) mirrors), and one or more second optical elements 660 (e.g., collimating lens) arranged to direct the light beams from the reflective element 650 to an object in an environment.

Each of the M sub-systems 610 can be an AC-coupled light emission apparatus as described in reference to FIG. 4A-4C, or a DC-coupled light emission apparatus as described in reference to FIGS. 5A-5C. As an example, if each laser diode (e.g., laser diode 518a) has an optical peak power of 5W, and if a sub-system has 10 laser diodes (i.e., N=10) coupled in series, the sub-system can output an optical peak power of 50 W. If the optical emission system 600 includes 20 sub-systems (i.e., N=10), the optical emission system 600 can output an optical peak power of 500 W. In some implementation, the optical emission system 600 is configured to output light having a wavelength within a near-infrared (NIR, e.g., wavelength range from 780 nm to 1400 nm, or a similar wavelength range as defined by a particular application) or a short-wavelength infrared (SWIR, e.g., wavelength range from 1400 nm to 3000 nm, or a similar wavelength range as defined by a particular application) wavelength range, which could provide better eye safety. Accordingly, the optical emission system 600 provides a flexible, fast, low-cost, and high-optical-power laser source that is suitable for LIDAR applications.

While the present disclosure has been described by way of example and in terms of a preferred embodiment, it is to be understood that the present disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A light emission system, comprising:
a first sub-system, comprising:
a storage inductor, comprising:
a first inductor terminal coupled to a voltage source; and
a second inductor terminal;
a storage capacitor, comprising:
a first capacitor terminal coupled to the first terminal of the storage inductor; and
a second capacitor terminal coupled to a reference voltage node;
a switch, comprising:
a control terminal coupled to a driver circuitry that sends a modulation signal to open or close the switch;
a first channel terminal coupled to the second inductor terminal; and
a second channel terminal coupled to the reference voltage node; and
a load, comprising:
N laser diodes coupled in series, wherein N is an integer larger than or equal to 2, wherein the N laser diodes comprise:
a first laser diode having a terminal coupled to the second inductor terminal; and
an N-th laser diode having a terminal coupled to the reference voltage node.

2. The light emission system of claim 1, further comprising:
a reflective element;
one or more first optical elements arranged to focus light beams generated by the N laser diodes to the reflective element; and
one or more second optical elements arranged to direct the light beams from the reflective element to an object in an environment.

3. The light emission system of claim 2, further comprising a plurality of sub-systems including the first sub-system, wherein the one or more first optical elements are arranged to focus light beams generated by the plurality of sub-systems to the reflective element.

4. The light emission system of claim 1, wherein the switch comprises a gallium nitride field-effect transistor.

5. The light emission system of claim 1, wherein the first sub-system is configured to operate under an idle mode, a charge mode, or an emission mode.

6. The light emission system of claim 5, wherein in the idle mode, the switch is open, and the storage capacitor is configured to store energy from the voltage source.

7. The light emission system of claim 6, wherein in the charge mode, the switch is closed, and the storage inductor is configured to store energy released from the storage capacitor.

8. The light emission system of claim 7, wherein in the emission mode, the switch is open, and the storage inductor is configured to release current to drive the N laser diodes.

9. The light emission system of claim 1, wherein the light emission system is configured to output light having a wavelength within a short-wave infrared spectrum.

10. The light emission system of claim 1, wherein the light emission system is configured to output light having a pulse width equal to or higher than 1 ns, and a peak output power equal to or higher than 1 kW.

11. A light emission system, comprising:
a first sub-system, comprising:
a storage inductor, comprising:
a first inductor terminal coupled to a voltage source; and
a second inductor terminal;
a storage capacitor, comprising:
a first capacitor terminal coupled to the first terminal of the storage inductor; and
a second capacitor terminal coupled to a reference voltage node;
a switch, comprising:
a control terminal coupled to a driver circuitry that sends a modulation signal to open or close the switch;
a first channel terminal coupled to the second inductor terminal; and
a second channel terminal coupled to the reference voltage node; and
a load, comprising:
a DC-blocking capacitor comprising:
a first DC-blocking capacitor terminal coupled to the second inductor terminal; and
a second DC-blocking capacitor terminal;
N laser diodes coupled in series, wherein N is an integer larger than or equal to 2, wherein the N laser diodes comprise:
a first laser diode having a terminal coupled to the second DC-blocking capacitor terminal; and
an N-th laser diode having a terminal coupled to the reference voltage node.

12. The light emission system of claim 11, further comprising a rectifier having a first rectifier terminal coupled to the second DC-blocking capacitor terminal and a second rectifier terminal coupled to the reference voltage node.

13. The light emission system of claim 11, further comprising:
a reflective element;
one or more first optical elements arranged to focus light beams generated by the N laser diodes to the reflective element; and
one or more second optical elements arranged to direct the light beams from the reflective element to an object in an environment.

14. The light emission system of claim 13, further comprising a plurality of sub-systems, wherein the one or more first optical elements arranged to focus light beams generated by the plurality of sub-systems to the reflective element.

15. The light emission system of claim 11, wherein the switch comprises a gallium nitride field-effect transistor.

16. The light emission system of claim 11, wherein the first sub-system is configured to operate under an idle mode, a charge mode, or an emission mode.

17. The light emission system of claim 16, wherein in the idle mode, the switch is open, and the storage capacitor is configured to store energy from the voltage source.

18. The light emission system of claim 17, wherein in the charge mode, the switch is closed, and the storage inductor is configured to store energy released from the storage capacitor.

19. The light emission system of claim 18, wherein in the emission mode, the switch is open, and the storage inductor is configured to release energy to drive the N laser diodes.

20. The light emission system of claim 1, wherein the light emission system is configured to output light having a wavelength within a short-wave infrared spectrum, a pulse width equal to or higher than ins, and a peak output power equal to or higher than 1 kW.

* * * * *